United States Patent
Karlquist

(10) Patent No.: US 6,922,117 B2
(45) Date of Patent: Jul. 26, 2005

(54) LUMPED ELEMENT TRANSMISSION LINE FREQUENCY MULTIPLEXER

(75) Inventor: Richard Keith Karlquist, Cupertino, CA (US)

(73) Assignee: Agilent Technologies, Inc., Palo Alto, CA (US)

(*) Notice: Subject to any disclaimer, the term of this patent is extended or adjusted under 35 U.S.C. 154(b) by 415 days.

(21) Appl. No.: 10/140,129

(22) Filed: May 7, 2002

(65) Prior Publication Data

US 2003/0210108 A1 Nov. 13, 2003

(51) Int. Cl.[7] .............................. H03H 9/54; H03H 9/56
(52) U.S. Cl. ...................................... 333/132; 333/189
(58) Field of Search .............................. 333/132, 133, 333/172, 186, 187, 189, 190

(56) References Cited

U.S. PATENT DOCUMENTS

| | | | | |
|---|---|---|---|---|
| 5,294,898 A | * | 3/1994 | Dworsky et al. | 333/187 |
| 5,859,473 A | * | 1/1999 | Ikata et al. | 257/723 |
| 6,262,637 B1 | * | 7/2001 | Bradley et al. | 333/133 |
| 6,472,954 B1 | * | 10/2002 | Ruby et al. | 333/133 |

* cited by examiner

Primary Examiner—Dean A. Takaoka

(57) ABSTRACT

A frequency multiplexer is disclosed. The frequency multiplexer comprises a lumped element transmission line comprising a plurality of inductances and capacitances, and a band pass filter coupled to a node of the lumped element transmission line, where the band pass filter includes a branch port that is coupled to the lumped element transmission line at a pass band of the band pass filter, and where the band pass filter exhibits a capacitive impedance in a stop band of the band pass filter. The band pass filter may comprise a series resonant circuit and a parallel resonant circuit, where the parallel resonant circuit is parallel resonant at nominally the same frequency at which the series resonant circuit is series resonant. An additional series resonant circuit may be coupled to the lumped element transmission line, where, at a resonant frequency of the additional series resonant circuit, the additional series resonant circuit is located at an electrical length of 90 degrees away from the series resonant circuit and the parallel resonant circuit on the lumped element transmission line, where the additional series resonant circuit exhibits a capacitive impedance at off-resonant frequencies.

16 Claims, 4 Drawing Sheets

LUMPED ELEMENT TRANSMISSION LINE FREQUENCY MULTIPLEXER

TECHNICAL FIELD

The invention relates generally to frequency multiplexers, and, more particularly, to a frequency multiplexer incorporating a lumped element transmission line.

BACKGROUND OF THE INVENTION

Many electronic applications benefit from the ability to multiplex several time varying electrical signals at different frequencies and possibly within different frequency bands into a single multi-frequency composite signal, and conversely, to demultiplex a multi-frequency electrical signal into its constituent individual electrical signals, each at a different frequency, and possibly in different frequency bands. For example, many communication systems, signal analysis devices, and other electronic devices discriminate, or filter, a signal in a frequency band of interest from a signal that may contain signals at many different frequencies.

An example of a two-way frequency multiplexer is a diplexer located in a communication device. A diplexer generally comprises a pair of band pass filter circuits coupled between an antenna (a common port) and transmits and receives circuitry in the communication device. A diplexer generally includes a first band pass filter in the form of a transmit band pass filter and a second band pass filter in the form of a receive band pass filter. The transmit band pass filter passes signals in a transmit frequency band and the receive band pass filter passes signals in a receive frequency band, which is different than the transmit frequency band. One side of the transmit band pass filter and the receive band pass filter is coupled to the antenna and the other side of each filter is coupled to the transmit and receive circuitry, respectively.

The two band pass filters allow full duplex communication by allowing transmit and receive signals to be processed simultaneously. The transmit band pass filter is designed to allow a transmit signal to pass, while not significantly attenuating the strength of the receive signal. The receive band pass filter is designed to pass a receive signal, while not significantly attenuating the strength of the transmit signal. Because the transmit signal is generally significantly higher in signal strength than the receive signal, the receive filter is also designed to attenuate the transmit signal to a level that will not interfere with the generally low-level receive signal and the sensitive receive circuitry.

Multiplexers of order n (where n is larger than 2) can be built to operate in a similar way, where a given frequency band will pass through one filter and be unaffected by the other n−1 filters. The conventional configuration for these multiplexers includes n filters connected in parallel at a common port. In order for the inactive filters to not load down this common port, they should be constructed to have input impedance much greater than the system impedance for frequencies in their stop bands. The stop band is the frequency range within which a filter is not resonant and will no longer pass the signal.

Unfortunately, this configuration is incompatible with many useful resonator circuits, including but not limited to, quartz crystal filters and film bulk acoustic resonator (FBAR) filters, because such resonators have an intrinsic shunt capacitance that makes them incapable of having a high input impedance in their stop bands.

If any significant number of these resonant circuits are combined in parallel at the common port of a frequency multiplexer, the impedance resulting from the combined capacitance of the resonators tends to fall below the system impedance, and thus degrades the performance of the multiplexer below the point of usefulness.

Therefore, it would be desirable to have a frequency multiplexer that exhibits acceptable performance using available resonator circuits.

SUMMARY OF THE INVENTION

The present invention provides a frequency multiplexer. One embodiment of the invention is a frequency multiplexer, comprising a lumped element transmission line comprising a plurality of inductances and capacitances, and, for each frequency, a series resonant circuit and a parallel resonant circuit coupled to a node of the lumped element transmission line, where the parallel resonant circuit is parallel resonant at nominally the same frequency at which the series resonant circuit is series resonant, and where the series resonant circuit and the parallel resonant circuit exhibit a capacitive impedance at off-resonant frequencies.

Other embodiments, features and advantages in addition to or in lieu of the foregoing are provided by certain embodiments of the invention, as are apparent from the description below with reference to the following drawings.

BRIEF DESCRIPTION OF THE DRAWINGS

The invention, as defined in the claims, can be better understood with reference to the following drawings. The components within the drawings are not necessarily to scale relative to each other, emphasis instead being placed upon clearly illustrating the principles of the present invention.

DETAILED DESCRIPTION OF THE INVENTION

While described below as a frequency demultiplexer, the embodiments of the invention will function equally well in reverse to that described, since it is implemented as a reciprocal network. Those having ordinary skill in the art will recognize that the term frequency multiplexer and frequency demultiplexer are synonymous, and therefore, the term "multiplexer" encompasses the term "demultiplexer." All variations are contemplated to be within the scope of the invention.

Figure 1:
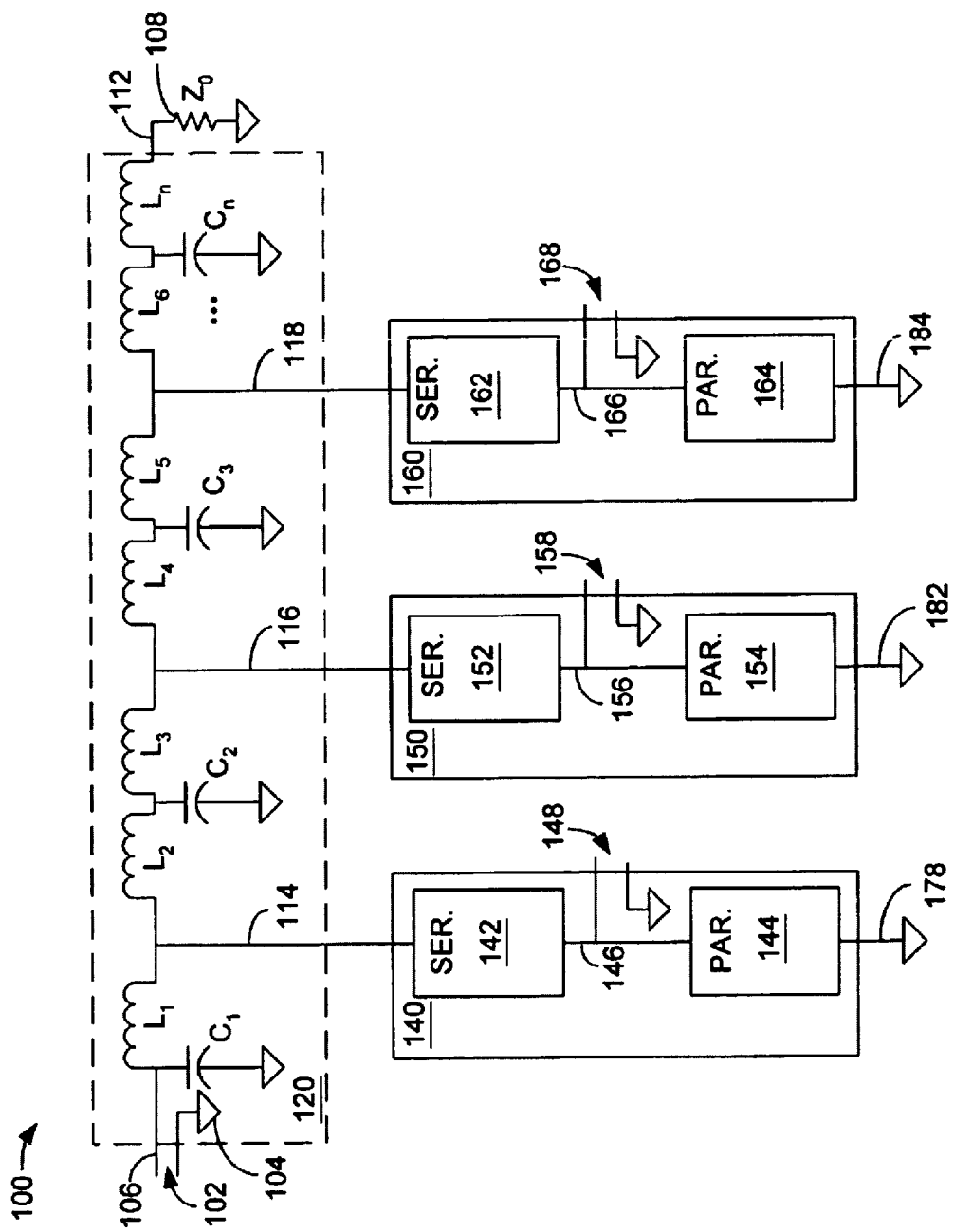
FIG. 1 is a schematic diagram illustrating a frequency multiplexer constructed in accordance with an aspect of the invention.

FIG. 1 is a schematic diagram illustrating a frequency multiplexer 100 constructed in accordance with an aspect of the invention. The frequency multiplexer 100 shown in FIG. 1 illustrates a simplified frequency multiplexer that incorporates certain aspects of the invention as described below. Additional embodiments of the invention will be illustrated in greater detail in FIGS. 2 and 3A–3C below. In accordance with an embodiment of the invention, the frequency multiplexer 100 includes a lumped element transmission line 120 to which a plurality of resonant circuits is coupled.

A transmission line (neglecting loss) is theoretically equivalent to an infinite series of infinitesimal series inductors and shunt capacitors configured in a ladder filter topology. Quantizing the ladder filter model into a finite number of discrete series inductor/shunt capacitor pairs can make a mathematical approximation of the transmission line. The lumped element transmission line 120 is a physical realization of this mathematical approximation utilizing actual lumped element inductors and capacitors. The inductors are indicated as $L_1$ through $L_n$ and the capacitors are indicated as $C_1$ through $C_n$.

The lumped element transmission line 120 includes a common port 102 through which a signal including a plurality of different frequencies is introduced. The common port 102 is coupled to the lumped element transmission line 120 via connection 106, and is coupled to ground 104. The lumped element transmission line 120 terminates via connection 112 and through a terminating impedance equal to the characteristic impedance (conventionally denoted as $Z_0$) of the lumped element transmission line 120. The terminating impedance is illustrated in FIG. 1 as a resistor 108 having an impedance of $Z_0$. Typically, the resistor 108 has a value of approximately 50 ohms (Ω).

In accordance with one embodiment of the invention, one or more bandpass filters 140, 150, and 160, replace every other shunt capacitor in the lumped element transmission line 120. Alternatively, a bandpass filter could replace every Nth shunt capacitor. For example, the bandpass filter 140 is coupled to the lumped element transmission line via connection 114 made to the node between the inductors $L_1$ and $L_2$. Similarly, the bandpass filter 150 is coupled to the lumped element transmission line 120 via connection 116 made to the node between inductors $L_3$ and $L_4$, and the bandpass filter 160 is coupled to the lumped element transmission line 120 via connection 118 made to the node between inductors $L_5$ and $L_6$. Although three bandpass filters 140, 150, and 160 are illustrated in FIG. 1 for simplicity, it is anticipated that a frequency multiplexer, such as frequency multiplexer 100, can include more or fewer bandpass filters.

The bandpass filter 140 includes a series resonant circuit 142 and a parallel resonant circuit 144. The series resonant circuit 144 is coupled to the lumped element transmission line 120 via connection 114. The parallel resonant circuit 144 is coupled to the series resonant circuit 142 via connection 146. The connection 146 forms a branch port 148 of the bandpass filter 140.

The components within the series resonant circuit 142 and the parallel resonant circuit 144 are selected so that, within the pass band of the branch port 148, the series resonant circuit 142 exhibits a low impedance while the parallel resonant circuit 144 exhibits a high impedance. Therefore, at the center frequency of the branch port 148, the branch port 148 is isolated from ground 178 and coupled to the lumped element transmission line 120.

The series resonant circuit 142 is series resonant in the pass band and the parallel resonant circuit 144 is parallel resonant in the pass band. Conversely, at frequencies within the stop band of branch port 148, the series resonant circuit 142 and the parallel resonant circuit 144 each are characterized by a capacitive impedance, referred to as a shunt capacitance, to be described below in FIG. 3B. The series resonant circuit 142 is series resonant at nominally the same frequency at which the parallel resonant circuit 144 is parallel resonant. While designed to be resonant at the same frequency, it is likely that the resonant frequency at which the series resonant circuit is series resonant and the frequency at which the parallel resonant circuit is parallel resonant may differ due to design and manufacturing tolerances. Such variations are considered to be within the scope of the invention. However, the series resonant circuit and the parallel resonant circuit each exhibit a capacitive impedance at off-resonant frequencies.

Further, the parallel resonant circuit 144, when implemented as an FBAR, as will be described below, has a much larger area than the series resonant circuit 142, so that its shunt capacitance is much larger than the shunt capacitance of the series resonant circuit 142. The large capacitance of the parallel resonant circuit 144 results in a very low impedance, such that it effectively couples connection 146 to ground 178 at frequencies other than the resonant frequency (i.e., at frequencies in the stop band of the branch port 148) of the parallel resonant circuit 144. This effectively connects the series resonant circuit 142 to ground 178, which is electrically equivalent to a shunt capacitor coupled to ground.

The design parameters of the series resonant circuit 142 are chosen so that its capacitance at off-resonant frequencies is the same as the capacitive value that would be present at connection 114 had the lumped element transmission line 120 not been tapped at that point. In other words, the capacitance value of the bandpass filter 140 at frequencies within the stop band should be the same as the values of the capacitors $C_1$, $C_2$, etc. in the lumped element transmission line 120.

Similarly, the band pass filter 150 includes series resonant circuit 152 and parallel resonant circuit 154, and the band pass filter 160 includes series resonant circuit 162 and parallel resonant circuit 164. The connection 156 between the series resonant circuit 152 and the parallel resonant circuit 154 forms the branch port 158. The connection 166 between the series resonant circuit 162 and the parallel resonant circuit 164 forms the branch port 168.

The output of each band pass filter forms a branch port having a unique center frequency that is centered in the pass band of the filter and chosen to fulfill the specifications of the frequency multiplexer 100. The selection of the components within the band pass filter 140 determines the resonant frequency of the band pass filter 140, and therefore, determines the pass band and the stop band of the band pass filter 140.

The bandpass filter 140 is equivalent to a capacitor at any frequency within the stop band of the band pass filter (i.e., at frequencies outside of the pass band of the bandpass filter 140). In the pass band of a particular port, the signal at the common port 102 is coupled to the branch port of the band pass filter that is at resonant frequency. In this manner, the frequency multiplexer 100 can provide a large number of branch ports in such a way that the capacitance of the band pass filters 140, 150 and 160 is incorporated into the lumped element transmission line 120, and thus allows the frequency multiplexer 100 to maintain its characteristic impedance independently of the number of branch ports.

The band pass filters 140, 150 and 160 can be any circuit or circuits that pass the desired port frequencies and that exhibit a capacitive impedance outside of the pass band. For example, in a preferred embodiment, each band pass filter 140, 150 and 160 can be formed using a film bulk acoustic resonator (FBAR), which will be described below. Alternatively, the band pass filters 140, 150 and 160 can be formed using any other resonant circuit having a capacitive impedance, such as a quartz crystal resonator. The connection of the resonant circuits to the lumped element transmission line 120 allows the frequency multiplexer 100 to be useful with a high port count.

In an alternative embodiment, a resonant circuit in which the capacitances and the inductances are interchanged would have an inductive reactance in the stop band. This type of resonant circuit could be incorporated into an lumped element transmission line 120 in which the capacitances and inductances are similarly interchanged. Further, bandpass filters could be substituted for series elements instead of shunt elements as described in FIG. 1. All such combinations are considered to be within the scope of the invention.

Figure 2:
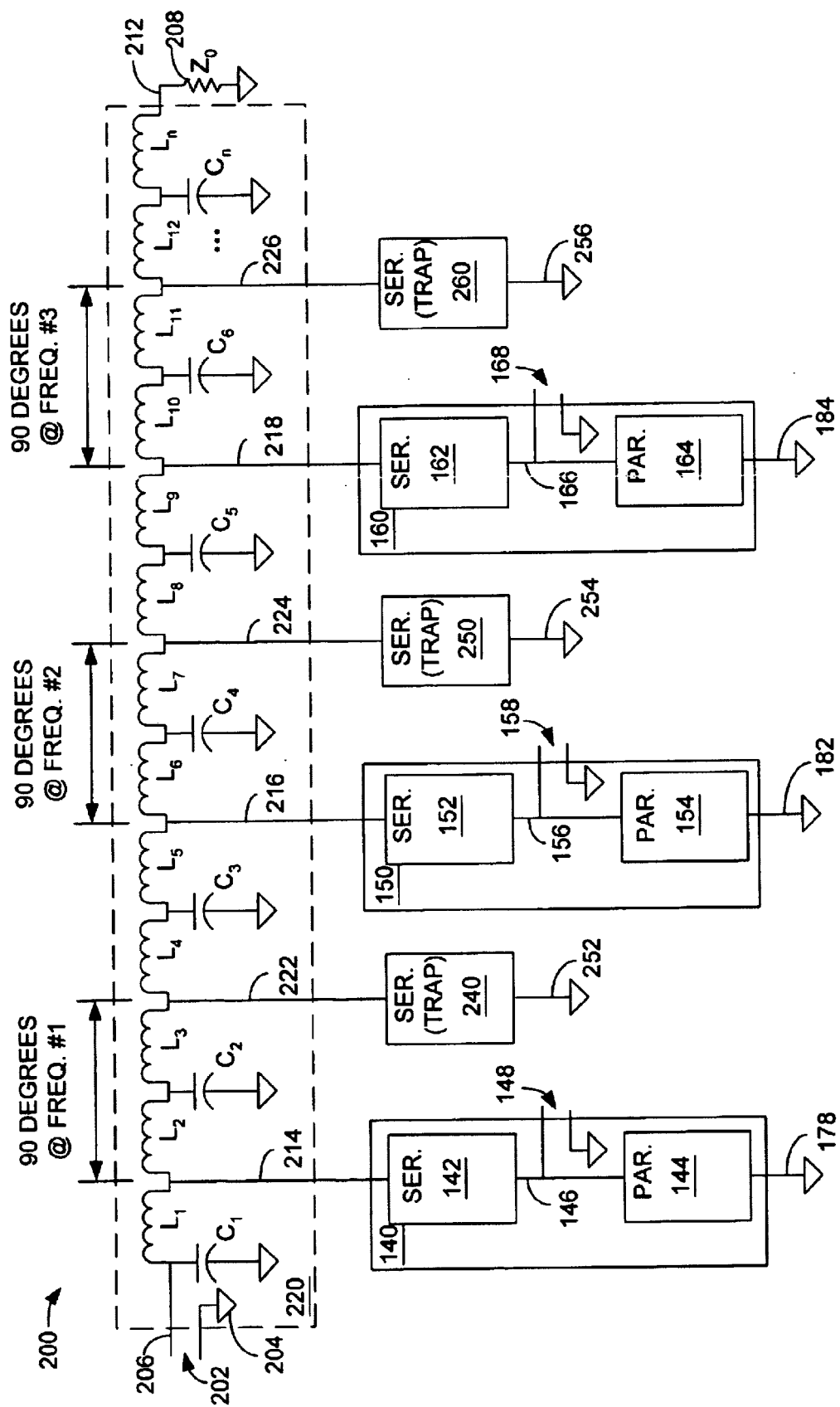
FIG. 2 is a schematic diagram illustrating an alternative embodiment of the frequency multiplexer of FIG. 1.

FIG. 2 is a schematic diagram 200 illustrating an alternative embodiment of the frequency multiplexer of FIG. 1. In FIG. 1, the remainder of the lumped element transmission line 120 beyond the point at which the band pass filter 140 is coupled remains in the circuit with respect to frequencies in the pass band of the band pass filter 140. Because the remainder of the lumped element transmission line 120 remains in the circuit, the signal at the common port 102 drives not only the branch port 148 at the desired frequency, but also drives the remainder of the lumped element transmission line 120, which has the terminating impedance ($Z_O$). This occurs because the terminating impedance $Z_O$ is coupled in parallel with the branch port 148.

Despite its increased complexity, the frequency multiplexer 200 in FIG. 2 provides advantages over the frequency multiplexer 100 of FIG. 1. The frequency multiplexer 200 includes a lumped element transmission line 220, which is similar to the lumped element transmission line 120 described above. A plurality of band pass filters 140, 150 and 160 are coupled to the lumped element transmission line 220 as described above.

However, the frequency multiplexer 200 includes an additional series resonant circuit (referred to as a "trap circuit") associated with each band pass filter 140, 150 and 160. For example, the trap circuit 240 couples to the lumped element transmission line 220 between inductors $L_3$ and $L_4$ via connection 222. The series resonant trap circuit 240 is coupled to the transmission 220 at a location 90° along the lumped element transmission line 220 from the point at which the band pass filter 140 is coupled to the lumped element transmission line 220. In this embodiment, 90° refer to the electrical length between the connections 214 and 222 along the lumped element transmission line 220 at the frequency of branch port 148. As known to those having ordinary skill in the art, electrical length is commonly denoted by β (beta) L, where β is the imaginary part of the propagation constant of the lumped element transmission line 220, and L is the equivalent physical length of the lumped element transmission line between the connections 214 and 222.

At frequencies in the pass band of the port 148, the series resonant trap circuit 240 terminates the lumped element transmission line 220 so that the remainder of the lumped element transmission line 220 that extends beyond the resonant trap circuit 240 is not driven by the signal at the common port 202. The series resonant trap circuit 240 is a series resonant at nominally the same frequency that the series resonant circuit 142 is series resonant and the parallel resonant circuit 144 is parallel resonant. The series resonant trap circuit 240 exhibits a capacitive impedance at off-resonant frequencies.

Essentially, without the series resonant trap circuit 240, the remainder of the lumped element transmission line 220 beyond the point at which the band pass filter 140 is coupled remains in the circuit with respect to frequencies in the pass band of the band pass filter 140. Because the remainder of the lumped element transmission line 220 remains in the circuit, the signal at the common port 202 drives not only the port 148 at the desired frequency, but also drives the remainder of the lumped element transmission line 220, which has the terminating impedance ($Z_O$). This occurs because the terminating impedance $Z_O$ is coupled in parallel with the branch port 148.

The placement of the resonant trap circuit 240, at an electrical length of 90 degrees from the band pass filter 140 effectively decouples the remainder of the lumped element transmission line 220 from the port 148.

At the center frequency of the branch port 148, the series resonant trap circuit 240 is equivalent to a low impedance connected directly to ground 252. A 90° transmission line terminated by a short circuit has an input impedance equivalent to an open circuit. This effectively disconnects, or decouples, the lumped element transmission line 220 beyond the attachment point of the branch port 148. For all other frequencies (i.e., off-resonant frequencies, or frequencies in the stop band), the series resonant trap circuit 240 exhibits a capacitive impedance. The series resonant trap circuit 240 effectively becomes a shunt capacitor that is absorbed into the lumped element transmission line 220, and therefore, electrically vanishes. It should be mentioned that the electrical length between the series resonant circuit 142 and the series resonant trap circuit 240 can be any odd multiple of 90°, such as 270°.

The series resonant circuit 142 is coupled to a parallel resonant circuit 144 such that the parallel resonance of the parallel resonant circuit 144 coincides with the series resonance of the series resonant circuit 142. Further, the parallel resonant circuit 144, when implemented as a FBAR, as will be described below, has a much larger area than the series resonant circuit 142, so that its shunt capacitance is much larger than the shunt capacitance of the series resonant circuit 142.

During operation in the pass band of the branch port 148, the impedance of the series resonant circuit 142 is low and the impedance of the parallel resonant circuit 144 is high. Thus, in the pass band of the branch port 148, the port is actively connected to the lumped element transmission line 220 and isolated from ground. At any frequency in the stop band of the branch port 148, both the series resonant circuit 142 and the parallel resonant circuit 144 appear as their respective shunt capacitances. The parallel resonant circuit 144, having a large capacitance, and hence, a low capacitive reactance, effectively short-circuits the branch port 148 to ground 178. This effectively grounds the series resonant circuit 142, resulting in the lumped element transmission line 220 being loaded by the shunt capacitance of the series resonant circuit 142. Thus, frequencies that are not in the desired frequency band of the branch port 148 will propagate along the transmission line 220 as if no branch port existed.

The combination of one pair of resonant circuits (i.e., the series resonant circuit 142 and the parallel resonant circuit 144) is extensible to multiple pairs. Whether implemented as individual resonant circuits or pairs of resonant circuits, the resonant circuits can be implemented using one of more FBARs. Such an arrangement is typically configured as a ladder filter, which will be described below with respect to FIG. 4. For example, a single FBAR ladder filter can be implemented to provide the series resonant circuit 142 and the parallel resonant circuit 144 in the resonant circuit 140.

Figure 3A:
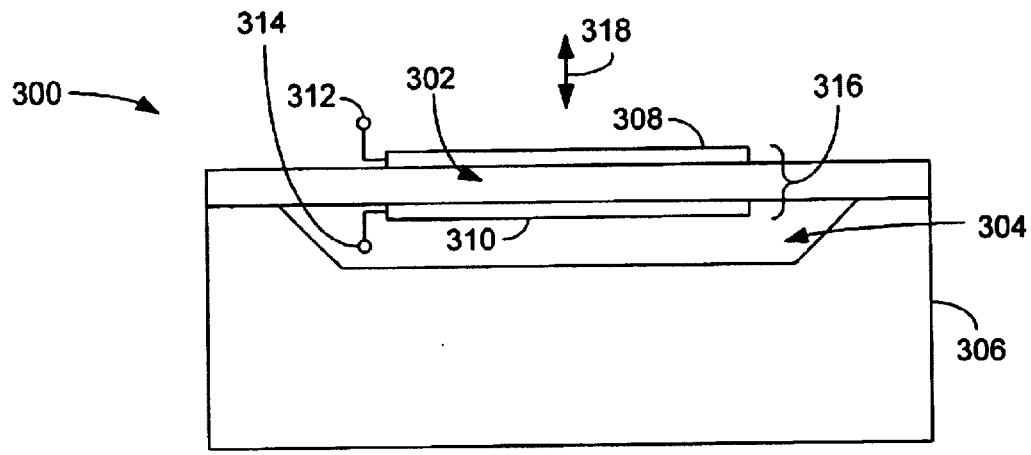
FIGS. 3A through 3C collectively illustrate the construction and fabrication of a film bulk acoustic resonator (FBAR).
Figure 3B:
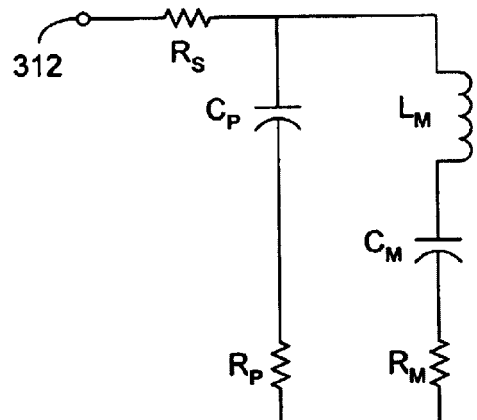
Figure 3C:
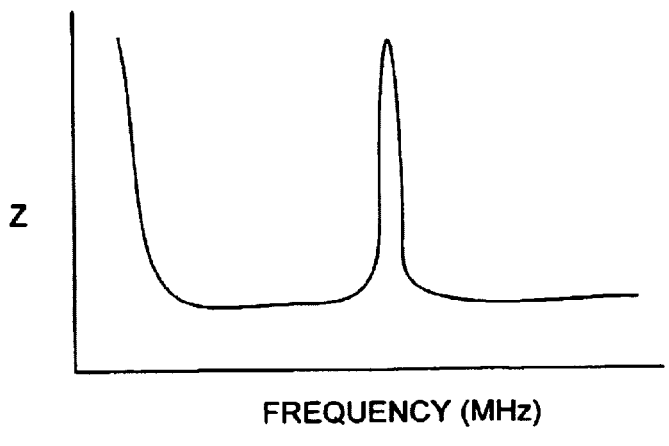

FIGS. 3A through 3C collectively illustrate the construction and electrical response of an FBAR. As mentioned above, the resonant circuits described with respect to FIGS. 1 and 2 can be implemented using one or more FBARs. The construction and operation of an FBAR will now be described.

Referring now to FIG. 3A, the FBAR 300 comprises a piezoelectric layer 302 suspended at its periphery over a well 304 defined by a substrate 306. The electrodes 308 and 310 are located on opposite surfaces of the portion of the piezoelectric layer that overlaps the well. Electrical connections are made to the electrodes 308 and 310 via the terminals 312 and 314, respectively. The piezoelectric layer 302 and the electrodes 308 and 310 form a piezoelectric resonator stack 316. The piezoelectric resonator stack 316 expands and contracts in the direction indicated by the arrow 318 in response to the magnitude and direction of a voltage applied between the electrodes.

When the piezoelectric resonator stack 316, comprising the piezoelectric layer 302 and the electrodes 308 and 310, is suspended at its periphery and has both of its major surfaces in contact with air, other ambient gas or is in a vacuum, the piezoelectric resonator stack forms a high-Q acoustic resonator. An alternating current (a.c.) signal applied via the terminals 312 and 314 to the electrodes 308 and 310 will cause the piezoelectric resonator stack to resonate when the signal has a frequency equal to the velocity of sound in the piezoelectric resonator stack divided by twice the weighted thickness of the stack, i.e., $f_r = c/2t_0$, where $f_r$ is the resonant frequency, c is the velocity of sound in the stack and $t_0$ is the weighted thickness of the stack. The resonant frequency of the piezoelectric resonator stack depends on the weighted thickness of the stack rather than the physical thickness because the different velocity of sound in the materials constituting the stack.

In a practical example of the FBAR 300 with a resonance at about 1,900 MHz, the substrate 306 is a wafer of single-crystal silicon, the piezoelectric layer 302 is a layer of aluminum nitride (AlN) about 2 $\mu$m thick and the electrodes 308 and 310 are layers of molybdenum about 0.1 $\mu$m thick. Molybdenum is the preferred material for the electrodes because, in this thin-film embodiment, the electrodes constitute a significant portion of the mass of the piezoelectric resonator stack 316. Thus, the acoustic properties of the material of the electrodes have a significant effect on the Q of the piezoelectric resonator stack 316. Molybdenum has superior acoustic properties to those of common electrode materials such as gold and aluminum, so the use of molybdenum electrodes enables the FBAR 300 to have a higher Q than electrodes of other materials. Further details of the structure and fabrication of FBARs are disclosed in U.S. Pat. No. 5,587,620 and in U.S. patent application Ser. No. 09/088,964, both of which are assigned to the assignee of this disclosure and incorporated herein by reference.

FIG. 3B shows an equivalent circuit for the FBAR 300. The circuit 300 is referred to as the Butterworth-Vandyke model. The main reactive component is the shunt capacitance $C_p$, which is the capacitance of the capacitor, formed by the electrodes 308 and 310 and the piezoelectric layer 302. The piezoelectric layer is the dielectric of the shunt capacitor $C_p$. The resistor $R_p$ represents the series resistance of the shunt capacitance $C_p$. The inductance, $L_M$, and the capacitance, $C_M$, represent the inductance and capacitance of the piezoelectric resonator stack 316. The resistor, $R_M$, represents the loss in the piezoelectric resonator stack. The resistor, $R_S$, represents the series electrical resistance of the connections between the terminals 312 and 314 and the piezoelectric resonator stack 316.

FIG. 3C is a graph showing the modulus of the impedance |Z| measured between the terminals 312 and 314 plotted against frequency. As the frequency increases, the impedance gradually falls due to the falling impedance of the shunt capacitance $C_p$. The impedance eventually reaches a minimum at the frequency of the series resonance between the mechanical inductance, $L_M$ and the mechanical capacitance, $C_M$. The impedance then sharply increases and reaches a maximum at the frequency of the parallel resonance between the mechanical inductance, $L_M$ and the series combination of the mechanical capacitance, $C_M$ and the shunt capacitance, $C_p$. Since shunt capacitance is about 20 times the mechanical capacitance, the frequency difference between the series and parallel resonance is small. The impedance falls steeply as the frequency increases above the frequency of the parallel resonance.

Figure 4:
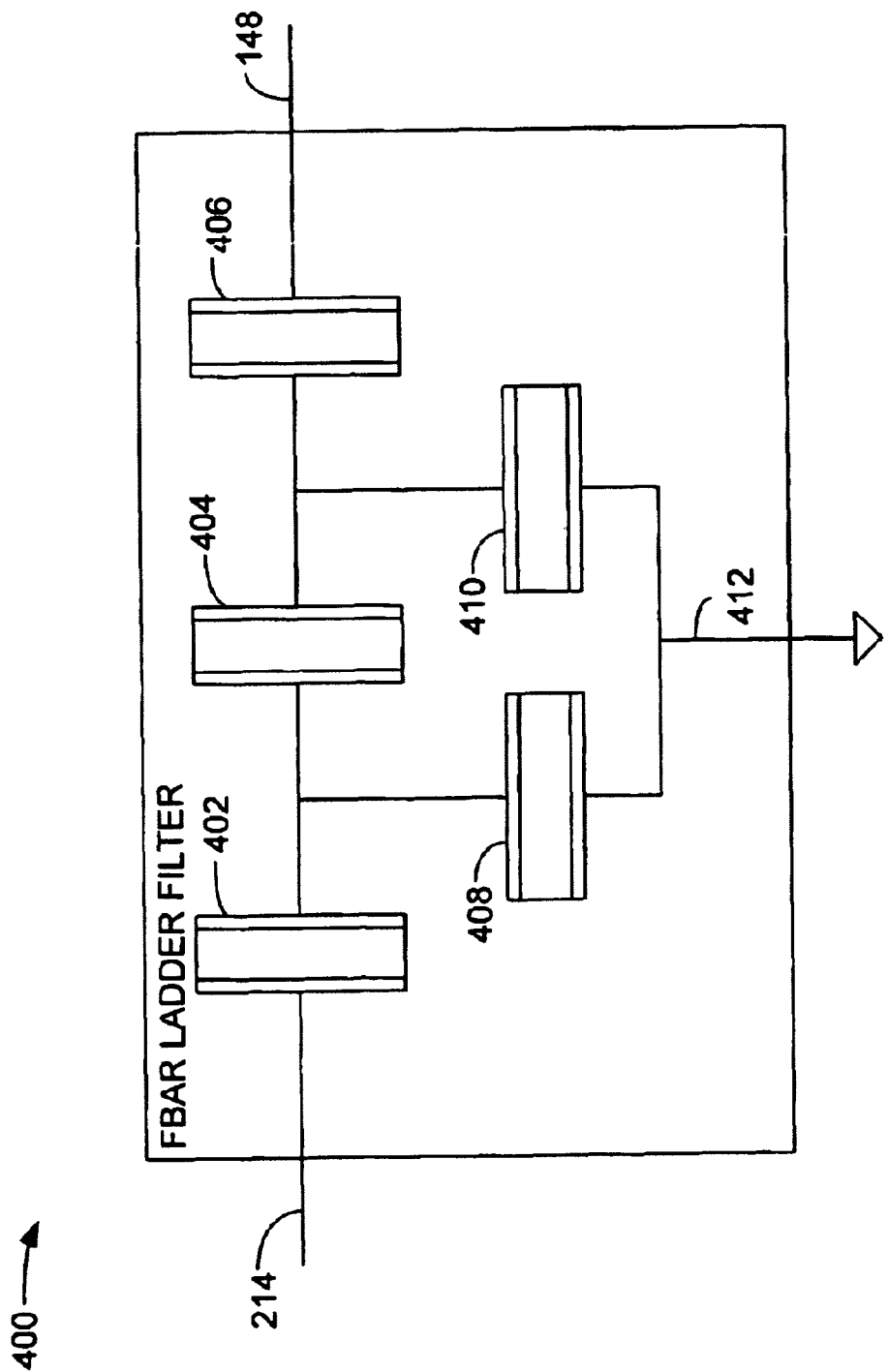
FIG. 4 is a block diagram illustrating the construction of an FBAR ladder filter, which is one manner of implementing the resonant circuits of the frequency multiplexers of FIGS. 1 and 2.

FIG. 4 is a block diagram 400 illustrating the construction of an FBAR ladder filter, which is one manner of implementing the band pass filters 140, 150 and 160, described above. The FBAR ladder filter 400 includes series FBARs 402, 404 and 406 and shunt FBARs 408 and 410 connected to form a ladder circuit. The FBARs 402, 404, 406, 408 and 410 can be fabricated in a common package, using a single piece of piezoelectric material, thus providing a compact and cost efficient ladder filter. The series FBARs are connected in series between connection 214 (FIG. 2) and the port 148 (FIG. 2). The shunt FBAR 408 is coupled between ground 412 and the node between series FBARs 402 and 404 and the shunt FBAR 410 is coupled between ground 412 and the node between series FBARs 404 and 406. Thus, in the example shown, the FBARs 402, 404, 406, 408 and 410 form a 2-½-stage ladder circuit. However, the number of stages in the ladder circuit is not critical to the invention. The number of full stages, each comprising one series FBAR and one shunt FBAR, and the number of half stages, each comprising one series FBAR or one shunt FBAR, depends upon the desired filter characteristics of the resonant circuit 140. As more stages are used in the ladder filter 400, the constraint that the shunt FBARS 408 and 410 have large shunt capacitances is relaxed due to voltage divider action.

Alternatively, a quartz crystal resonator, which is electrically similar to an FBAR, may be implemented in the band pass filters described above.

It will be apparent to those skilled in the art that many modifications and variations may be made to the preferred embodiments of the present invention, as set forth above, without departing substantially from the principles of the present invention. For example, the frequency multiplexer can be implemented using any type of resonant circuit that exhibits a parallel capacitance at off-resonant frequencies in cooperation with an lumped element transmission line. Furthermore, the frequency multiplexer can be used in an orthogonal frequency domain multiplex (OFDM) radio transmission system, a real-time spectrum analyzer, or a delay line discriminator. All such uses, modifications and variations are intended to be included herein within the scope of the present invention, as defined in the claims that follow.

What is claimed is:

1. A frequency multiplexer, comprising:
    a lumped element transmission line comprising a plurality of reactances; and
    for each frequency a series resonant circuit and a parallel resonant circuit, where the parallel resonant circuit is parallel resonant at normallly the same frequency at which the series resonant circuit is series resonant, where the series resonant circuit and the parallel resonant circuit exhibit a reactive impenance at off-resonant frequencies, and wherein the series resonant circuit and the parallel resonant circuit provides at least one of the plurality of reactances in the lumped element transmission line.

2. The frequency multiplexer of claim 1, wherein the series resonant circuit and the parallel resonant circuit each comprise at least one film bulk acoustic resonator (FBAR).

3. The frequency multiplexer of claim 1, wherein the series resonant circuit and the parallel resonant circuit each comprise a quartz crystal resonator.

4. The frequency multiplexer of claim 1, further comprising an additional series resonant circuit coupled to the lumped element transmission line, where, at a resonant frequency of the additional series resonant circuit, the additional series resonant circuit is located at an electrical length of 90 degrees away from the series resonant circuit and the parallel resonant circuit on the lumped element transmission line, where the additional series resonant circuit exhibits a capacitive impedance at off-resonant frequencies.

5. The frequency multiplexer of claim 1, wherein the plurality of reactances comprises a plurality of capacitors and inductors, wherein the reactive impedance comprises a capacitive impedance, and wherein the first series resonant circuit and the first parallel resonant circuit replace one of the plurality of capacitors.

6. A method of multiplexing a plurality of signals according to frequency, the method comprising:
supplying a signal having a plurality of frequencies to a common port of a lumped element transmission line comprising a plurality of reactances; and
filtering a desired frequency from the signal by passing the signal through a first series resonant circuit and a first parallel resonant circuit, where the series resonant circuit is normally series resonant at the desired frequency and the first parallel resonant circuit is nominally parallel resonant at the desired frequency, where the first series resonant circuit and a first parallel resonant circuit exhibit a reactive impedance at off-resonant frequencies, and wherein the first series resonant circuit and the first parallel resonant circuit provides at least one of the plurality of reactances in the lumped element transmission line.

7. The method of claim 6, wherein the first series resonant circuit and the parallel resonant circuit each comprise at least one film bulk acoustic resonator (FBAR).

8. The method of claim 6, wherein the first series resonant circuit and the parallel resonant circuit each comprise a quartz crystal resonator.

9. The method of claim 6, further comprising decoupling the lumped element transmission line at the series resonant frequency by providing a second series resonant circuit located at an electrical length of 90 degrees along the lumped element transmission line away from the first series resonant where the second series resonant circuit exhibits a capacitive impedance at off-resonant frequencies.

10. The frequency multiplexer of claim 8, wherein the plurality of reactances comprises a plurality of capacitors and inductors, wherein the reactive impedance comprises a capacitive impedance, and wherein the first series resonant circuit and the first parallel resonant circuit replace one of the plurality of capacitors.

11. A frequency multiplexer, comprising:
a lumped element transmission line comprising a plurality of reactances; and
a band pass filter coupled to a node of the lumped element transmission line, where the band pass filter includes a series resonant circuit, a parallel resonant circuit, and a branch port that is coupled to the lumped element transmission line at a pass band of the band pass filter, where the band pass filter exhibits a reactive impedance in a stop band of the band pass filter, and wherein the band pass filter provides at least one of the plurality of reactances in the lumped element transmission line.

12. The frequency multiplexer of claim 11, wherein the band pass filter further comprises:
a series resonant circuit and a parallel resonant circuit, where the parallel resonant circuit is parallel resonant at nominally the same frequency at which the series resonant circuit is series resonant.

13. The frequency multiplexer of claim 12, wherein the series resonant circuit and the parallel resonant circuit each comprise at least one film bulk acoustic resonator (FBAR).

14. The frequency multiplexer of claim 12, wherein the series resonant circuit and the parallel resonant circuit each comprise a quartz crystal resonator.

15. The frequency multiplexer of claim 12, further comprising an additional series resonant circuit coupled to the lumped element transmission line, where, at a resonant frequency of the additional series resonant circuit, the additional series resonant circuit is located at an electrical length of 90 degrees away from the series resonant circuit and the parallel resonant circuit on the lumped element transmission line, where the additional series resonant circuit exhibits a capacitive impedance at off-resonant frequencies.

16. The frequency mutiplexer of claim 11, wherein the plurality of reactances comprises a plurality of capacitors and inductors, wherein the reactive impedance comprises a capacitive impedance, and wherein the bandpass filter replaces one of the plurality of capacitors.

* * * * *

UNITED STATES PATENT AND TRADEMARK OFFICE
CERTIFICATE OF CORRECTION

PATENT NO. : 6,922,117 B2
DATED : July 26, 2005
INVENTOR(S) : Karlquist

It is certified that error appears in the above-identified patent and that said Letters Patent is hereby corrected as shown below:

<u>Title page,</u>
*Primary Examiner*, delete "Dean A. Takaoka" and insert -- Dean O. Takaoka --, therefor.

<u>Column 8,</u>
Line 66, delete "normallly" and insert -- nominally --, therefor.

<u>Column 9,</u>
Line 2, delete "impenance" and insert -- impedance --, therefor.
Line 28, delete "of" and insert -- for --, therefor.
Line 36, after "the" insert -- first --.
Line 37, delete "normally" and insert -- nominally --, therefor.

<u>Column 10,</u>
Line 4, after "resonant" insert -- circuit --.
Line 6, delete "claim 8" and insert -- claim 6 --, therefor.
Line 47, delete "mutiplexer" and insert -- multiplexer --, therefor.

Signed and Sealed this

Sixth Day of December, 2005

JON W. DUDAS
*Director of the United States Patent and Trademark Office*